US006968472B2

(12) United States Patent
Fernald

(10) Patent No.: US 6,968,472 B2
(45) Date of Patent: Nov. 22, 2005

(54) SERIAL DATA INTERFACE

(75) Inventor: Kenneth W. Fernald, Austin, TX (US)

(73) Assignee: Silicon Labs CP. Inc., Austin, TX (US)

(*) Notice: Subject to any disclaimer, the term of this patent is extended or adjusted under 35 U.S.C. 154(b) by 575 days.

(21) Appl. No.: 10/127,185

(22) Filed: Apr. 22, 2002

(65) Prior Publication Data

US 2003/0200359 A1    Oct. 23, 2003

(51) Int. Cl.[7] .......................... G06F 13/42; G06F 1/04
(52) U.S. Cl. ...................... 713/400; 713/600
(58) Field of Search .................. 365/185.04; 710/100, 710/302; 711/103; 714/726; 701/200

(56) References Cited

U.S. PATENT DOCUMENTS 4,686,480 A * 8/1987 Katto et al. ................ 327/176
5,142,960 A * 9/1992 Iwase et al. ................ 84/662
5,473,758 A * 12/1995 Allen et al. ................ 711/103
5,901,360 A * 5/1999 Kim .......................... 340/7.26
5,903,737 A * 5/1999 Han .......................... 710/100
5,948,039 A * 9/1999 Kume et al. ................ 701/200
6,044,423 A * 3/2000 Seo et al. ................... 710/302
6,212,097 B1 * 4/2001 Kihara et al. .......... 365/185.04
6,286,118 B1 * 9/2001 Churchill et al. ........... 714/726
6,894,914 B2 * 5/2005 Perroni et al. ............... 365/63

* cited by examiner

Primary Examiner—Thomas Lee
Assistant Examiner—Ji H. Bae
(74) Attorney, Agent, or Firm—Howison & Arnott, L.L.P.

(57) ABSTRACT

Serial Data Interface. A method of serial communication is provided with an integrated circuit. The operation of the integrated circuit is first interrupted on at least one input/output associated with the operation of the integrated circuit. Serial data is then transmitted over the at least one input/output, the operation of which was interrupted, and during the interruption thereof.

38 Claims, 8 Drawing Sheets

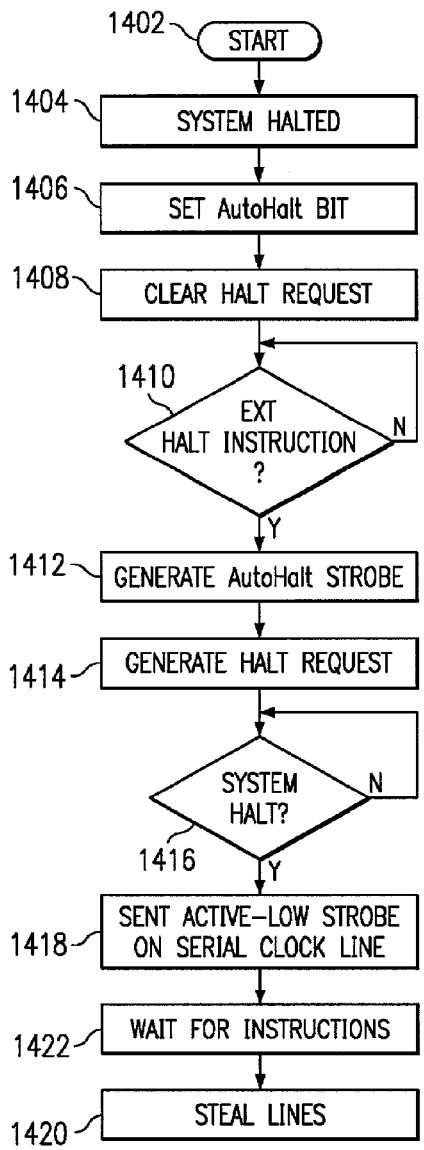
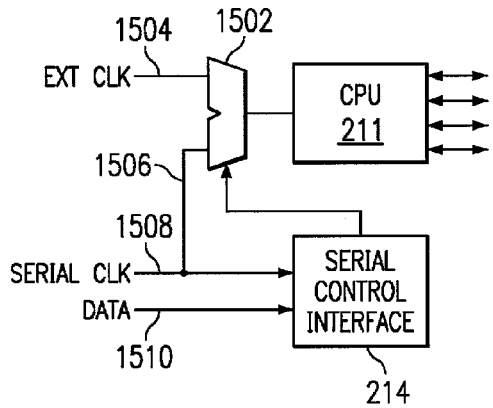
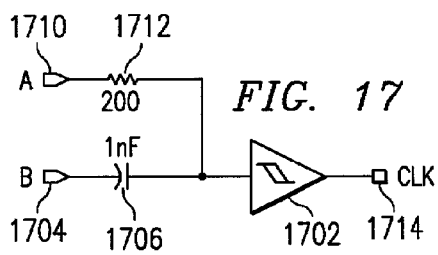
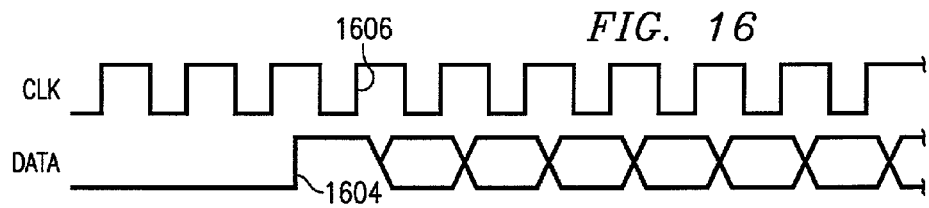

SERIAL DATA INTERFACE

TECHNICAL FIELD OF THE INVENTION

The present invention pertains in general to serial data interfaces and, more particularly, to a serial data interface for mapping data functions and/or timing functions on to a single bi-directional push-pull data bus.

BACKGROUND OF THE INVENTION

Due to the limited number of pins that are available on present multi-function integrated circuits, some pins have functions thereof multiplexed to allow different functions to be associated therewith. Some of these can be associated with timing functions, some with data functions and some with status functions. For low pin count devices, one or more pins are typically dedicated to data transfer of multi-bit data words. These data pins typically use some type of serial data protocol, either synchronous or asynchronous. In the synchronous case, there are typically required two pins, one for data and one for clock information. However, there are some synchronous systems that utilize a single wire for transmitting both data and clock information which require some type of clock recovery system. In these clock recovery protocols, an encoding system such as Manchester Coded PSK is typically utilized. In asynchronous systems, a master/slave configuration is utilized. All of these serial data interfaces require some type of mapping that maps data from a user PC or device onto the single bi-directional data pin (for a single wire data protocol) utilizing the appropriate protocol.

BRIEF DESCRIPTION OF THE DRAWINGS

For a more complete understanding of the present invention and the advantages thereof, reference is now made to the following description taken in conjunction with the accompanying Drawings in which:

FIG. 14 illustrates a flowchart of the AutoHalt feature;

FIG. 15 illustrates a diagrammatic view of the TestMode operation;

FIG. 16 illustrates a timing diagram for the TestMode operation;

FIG. 17 illustrates an interface to a clock pin from a parallel port; and

DETAILED DESCRIPTION OF THE INVENTION

Figure 1:
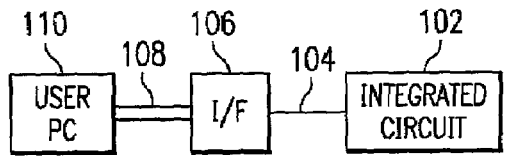
FIG. 1 illustrates an overall diagrammatic view of the system of the present disclosure.

Referring now to FIG. 1, there is illustrated a diagrammatic view of an integrated circuit 102 having associated therewith interface circuitry for interfacing one or more pins thereof to a serial data bus 104, either one or two wires through a mapping interface block 106—a translator 106. The translator 106 is operable to map a conventional data protocol from a data bus 108 that interfaces with a user PC 110 to the serial data bus 104. The bus 108 can be either a serial data bus such as an RS232 data bus or parallel port. The serial data bus 104 is bi-directional and can be synchronous or asynchronous. In the first disclosed embodiment, this is a synchronous data bus.

Figure 2:
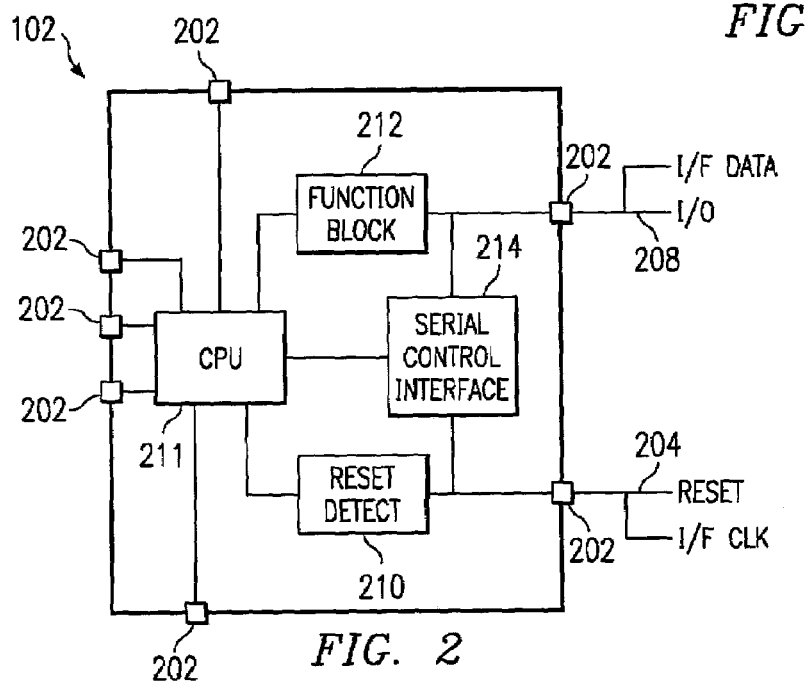
FIG. 2 illustrates a diagrammatic view of the integrated circuit with the serial interface disposed thereon.

Referring now to FIG. 2, there is illustrated a diagrammatic view of one embodiment of the present disclosure. The integrated circuit 102 is illustrated as having multiple pins 202 associated therewith, two of which are associated with the serial data interface. In this exemplary disclosure, one of the pins 202 is associated with a reset function in the normal operating mode and is connected to a reset signal on an external line 204, and a second pin 202 is associated with some type of input/output function in the normal operating mode, this being a bi-directional or a unidirectional pin. This is connected to an I/O output line 208. The reset pin in normal operating mode is connected to a reset detect circuit 210 which, when the reset line 204 goes low for a predetermined amount of time, will cause a device reset to be transmitted to an internal CPU 211 (and various other blocks that may require reset—not shown). The CPU 211 runs the general functions on the integrated circuit 102, it being understood that many functions can be represented in this block, such as analog-to-digital converters, digital-to-analog converters, multiplex functions, internal data storage in the form of non-volatile memory and volatile memory, and many more functions. The CPU 211 is illustrated as interfacing with all of the pins 202 in some form with the one pin associated with the output line 208 having associated therewith a function block 212. This function block 212 illustrates that this may be a driver or a receiver. It should be understood that each of the other pins would have some type of buffer circuit of some sort associated therewith, although not illustrated for simplicity purposes.

The pin associated with the reset detect circuit 210 and the pin associated with the function block 212 are multi-function or shared pins that operate in the normal operating mode with one functionality and in a serial data transfer mode with a second functionality. The pin associated with the function block 212 is shared with the serial interface data function, and the pin 202 associated with the reset detect circuit 210 and the reset function is shared with the serial interface timing or clock information from the serial data. A serial control interface 214 is provided for interfacing with the pin 202 associated with function block 212 and the pin 202 associated with the reset detect circuit 210 in order to receive the serial data and the serial clock and interface with the CPU 211. As will be described in more detail hereinbelow, in normal operation, the CPU 211 operates on its own clock whereas the control interface 214 operates on the serial clock received on the pin 202 associated with the reset function. As will also be described hereinbelow, the interface in the disclosed embodiment operates by detecting the presence of a serial clock signal on the reset pin and then taking possession ("stealing") of the data pin associated with the output I/O function 208 in order to receive/transmit serial data. However, the "stealing" of the data pin can be triggered by a signal other than the serial clock and on any other pin, even including the shared data pin. Further, a serial clock signal would not be required for an asynchronous protocol.

Figure 3:
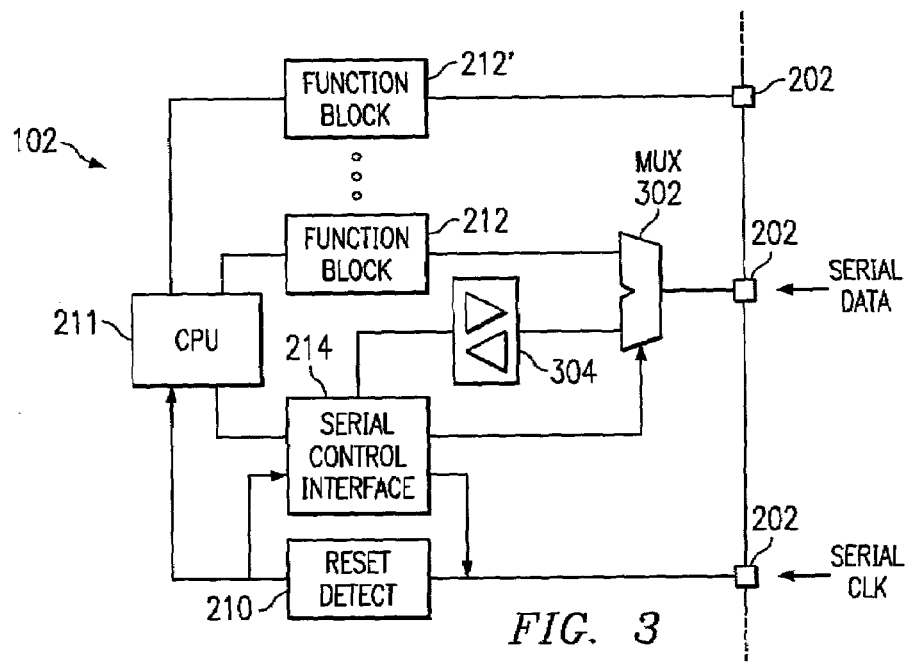
FIG. 3 illustrates a more detailed diagram of the embodiment of FIG. 2.

Referring now to FIG. 3, there is illustrated a more detailed diagram of the serial data interface on the integrated circuit 102. As noted hereinabove, the function block 212 associated with the one pin 202 that shares its function with that of the serial data, the "shared" data pin, there are also provided similar function blocks 212' associated with other of the pins 202. To enable sharing of the data pin, a multiplexor 302 is provided having two multiplexed input/outputs, one input/output associated with the function block 212 and one associated with a data transceiver 304, and another unmultiplexed input/output associated with the pin 202 and connected thereto. The multiplexor 302 is operable to connect the pin 202 either to the function block 212 or the transceiver 304, this controlled by a control interface 214. When the multiplexor 302 is interfaced to the transceiver 304, this is referred to as "stealing" or possessing the functionality of the pin 202 that was initially associated with function block 212.

SUMMARY OF THE INVENTION

The present invention described herein comprises, in one aspect thereof, a method of serial communication with an integrated circuit. The operation of the integrated circuit is first interrupted on at least one input/output associated with the operation of the integrated circuit. Serial data is then transmitted over the at least one input/output, the operation of which was interrupted, and during the interruption thereof.

In the present disclosure, there is illustrated only a single multiplexor 302 associated with a single block 202. In the serial data mode, the initiation thereof is provided by pulling the reset pin low for a short duration of time and then high, the duration being less than that for the reset operation, as will be described in more detail hereinbelow. This is recognized by the serial interface controller 214 as a "start bit." When this occurs, the system is preconfigured to select only one pin as a serial data pin, in this embodiment. However, it could be that more than one pin were selected to allow writing of more than one bit at a time, i.e., there could be a two bit input, or there could be an eight bit input for receiving eight bits at a time. However, in the present disclosure, it is only a single bit. Further, the system could be originally configured such that more than one pin had a multiplexor 302 associated therewith. A preconfigured register could assign any one of the pins as a serial data input. However, this would have to be preconfigured such that the serial interface controller 214 would know which multiplexor or which pin to possess during the serial data mode.

Figure 4:
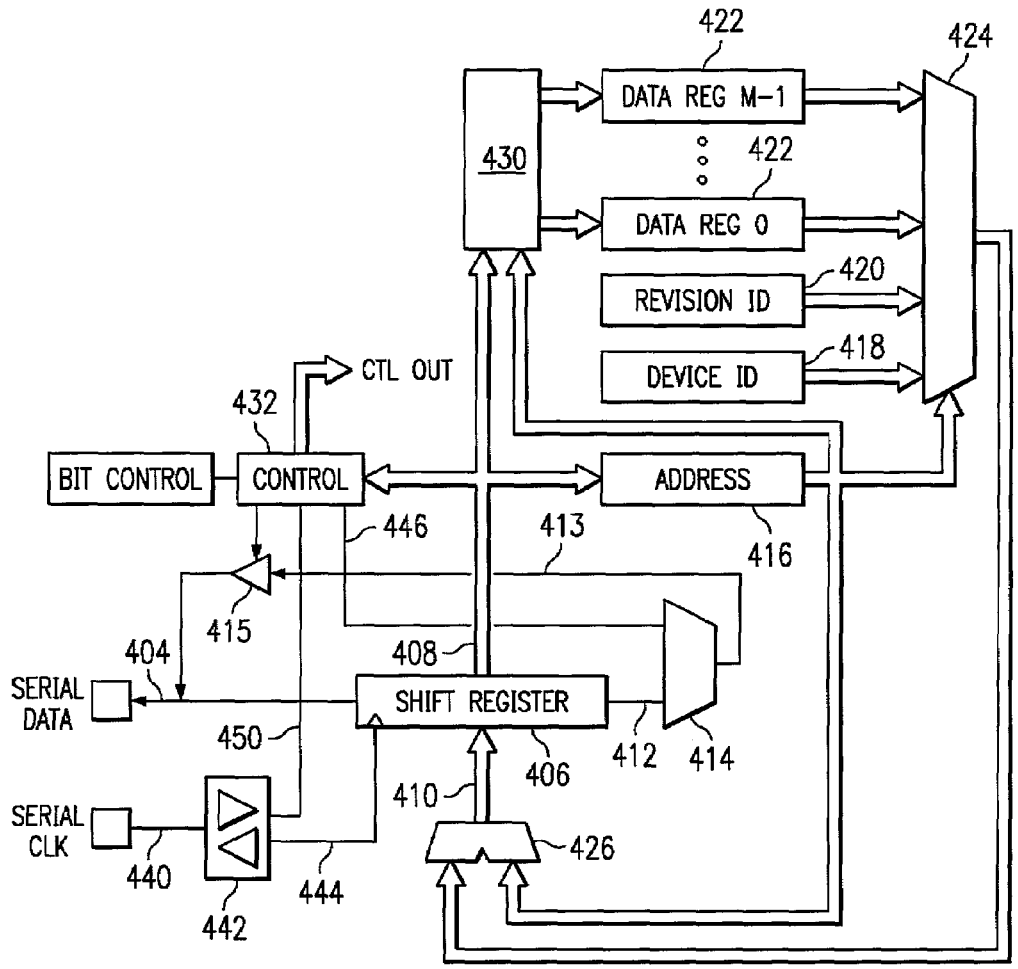
FIG. 4 illustrates a detailed diagram of the serial interface controller.

Referring now to FIG. 4, there is illustrated a more detailed diagram of the serial interface controller 214. In general, the serial interface controller is similar to a JTAG interface wherein the TMS, TDI and TDO functions have all been mapped onto a single bi-directional push-pull data pin. The JTAG interface typically requires four pins, one for data in, one for data out, one for clock and one for state machine control. In the present disclosure, all data is transmitted and received LSB first. The direction of the data is specified by the instruction protocol, such that contention between the device and the interface master is never allowed. The serial data is received on a pin 404 and input to a shift register 406. The shift register 406 is a serial-parallel-serial data register that can sample or drive the data pin 404. For input of data, data is input thereto, converted to parallel data and the parallel data output onto a data bus 408. For output of data, parallel data is received by shift register 406 from a data bus 410 and output on a serial data line 412 to one input of a multiplexor 414 to a serial data line 413. Serial data line 413 is input to a gated driver 415 for output to the serial line 404.

The serial clock is received on a serial clock line 440 and interfaced to a bi-directional driver block 442. When the clock is being received, i.e., the line is being pulled low and then transitioned high, a clock signal will be output on a line 444 to the clock input of the shift register 406. However, a control block 432 that controls the overall operation of the system, which will be described in more detail hereinbelow, has the option of forcing the line 440 low to provide status signals to the translator 106 via the serial clock line 440. Further, the controller 432 also has the option of forcing the data line high with the multiplexor 414 by placing a "1" (this could also be "0" in some other type of application) on a line 446 input to the other input of multiplexor 414 that is connected to the line 413. The controller 432, when sending a signal to the external system via the serial clock line 440, will generate a pulldown signal on a line 450. This will be described in more detail hereinbelow.

The serial interface controller 214 provides access to on-chip programming, tests, and debug logic through a set of registers that consist of an address register 416, a device ID register 418, a revision ID register 420 and a plurality of data registers 422, there being M of these registers. These registers represent an input to any function on the integrated circuit 102. For example, the register could be an input register to Flash memory or a register setting a flag. By loading select ones of these registers, the integrated circuit can be initialized, such that an initial set of configuration data is loaded that will be accessed upon a device reset.

Each of the data registers 422 and the address register 416 are illustrated as having an input thereof connected to the output of a decode block 430, which selects one of the data registers 422 for writing of information thereto. The input of the decode block 430 is connected to the bus 408, the ID register 420 and the device ID register 418 being read-only registers with no input. Each of the registers 418–422 have the output thereof input to a multiplexor 424 which is addressable by the output of the address register 416. Therefore, an address can be loaded into the address register 416, which will select, during a AddressRead command, the output of one of the registers 418–422. The output of the multiplexor 424 is input to one input of a two input multiplexor 426, the other input thereof connected to the output of the address register 416. Therefore, either the contents of the address register can be read by itself or the contents of one of the addressed other registers can be read. During a Write operation, the address register 416 is first written and then this address selects one of the data registers 422 with a decode block 430.

The overall operation is controlled with a central controller 432 that provides control outputs to the various multiplexors and the such. The controller 432 contains all of the serial interface protocol that provides access to all of the interface registers, plus reset and wait state capabilities. The address register 416 in general defines which data register will be accessed during subsequent data instructions, whereas the device ID register provides an eight-bit device ID that must be read in order to determine certain aspects about the device. The revision ID register provides an eight-bit revision ID that can be read and utilized to determine information about the configuration of the device, this configuration being hard coded into the integrated circuit 102. The data contained in the data registers 422 is associated with device-specific functions.

Although the data registers 422 are illustrated as having the ability to be both written to and read from, this is not necessarily required for all functions. A data register can be defined as a read-only register or it can return an undefined value when read. Also, the data register can be written with a single value but return another value. For example, a data register may serve as a control register when written but return status information when read. This also applies to the address register 416.

From a timing standpoint, all data that is received on the serial pin 404 is timed relative to rising edges of the serial clock. The device both samples data on the serial line 404 and changes its output values on rising edges of the serial clock. The bit timing is designed such that the state of the serial data line can remain constant when the serial clock line is low. This simplifies the serial data timing and allows the interface to be "bit-banged" using a PC parallel port with the addition of a simple one-shot circuit, as will be described in more detail hereinbelow. The general timing allows the serial data pin to maintain its user-defined state between interface instructions. When a start bit of a serial data instruction is received, it forces the shared data pin as an input to the serial data operation. During normal operation in the user-defined state (non-serial data operation), the actual value of the start bit is ignored by the interface logic. After the start bit, the translator 106 then enables its data driver in order to transmit appropriate instruction bits. The controller 432 is enabled to examine the first two bits, in this disclosed embodiment, as instruction bits. Of course, this defines only four instructions, whereas more bits could be associated with the instructions to incorporate more instructions into the system. As will be described hereinbelow, Write instructions end with a stop bit similar to the start bit, whereas Read instructions do not use a stop bit.

Figure 5:
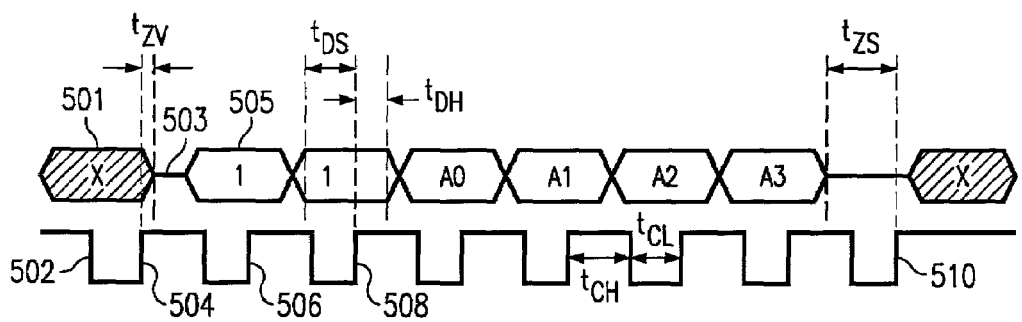
FIG. 5 illustrates a timing diagram for the AddressWrite timing.

Referring now to FIG. 5, there is illustrated a timing diagram for the AddressWrite command. This example illustrates a Write operation to a four-bit address register. The instruction begins with a start bit when the reset line initially goes low, at a transition 502, where the function block 212 is active in the normal operating mode, such that the serial data pin is under control of the CPU 211. However, when the next transition 504 occurs, this occurring before the reset time of the reset detect block 210, this indicates that the serial mode is being initiated. If it were a Reset operation, typically, the time between a negative going transition and a positive going transition must be greater than five or ten $\mu s$. However, if it is less than that, then this indicates a start bit. Therefore, the start bit indicates that the possession of the data pin should be directed to the serial interface controller 214 and taken away from the CPU 211 and function block 212. The shaded areas on the data indicate the data line is being driven by either the serial interface circuitry on the integrated circuit 102 or other circuitry on the integrated circuit 102 and non-shaded areas indicate driving by the translator 106. After the transition 504, the translator 106 will enable its output driver.

In the diagram, the box 501 indicates that the function block 212 has possession of the pin, whereas the translator 106 tri-states its driver. At edge 504, the driver associated with translator 106 is enabled, which has some delay associated therewith, resulting in the output of the translator driver being tri-stated, indicated by a state 503. This is where possession of the pin is transferred or "stolen," indicated by a time period $t_{zv}$, of approximately 1 to 20 ns. This will result in data being output in a data valid field 505 for the first command bit at the end of state 503. This data will then be output by the translator 106 and will be shifted in at the next rising edge, edge 506, to shift in an instruction bit, a "1" bit, and then another and subsequent data bit will be shifted in at the following and second rising transition 508 to shift in another instruction bit, a "1" bit. For an AddressWrite command, the control word is a "11" that is read by the controller 432, which controller 432 is operable to recognize the first two bits shifted in as the appropriate command to determine whether this is a Read or a Write operation. Once it recognizes the first two bits as being a "11," it then knows to look for follow-on bits as the address information. It should be understood that the reason that only four bits are associated with the address is that a previous reading of the device ID register 418 indicated the length of the address register to be four bits. The next four rising edges will shift into four address bits which will then, after shifting therein, be loaded into the address register 416. After shifting in of the last of the four address bits, the translator 106 will tri-state its output at a state 509, and then a rising transition 510 will denote the end of the stop bit and will change the state of the multiplexor 302 in order to allow functionality to be returned to the CPU 211 in the function block 212.

Figure 6:
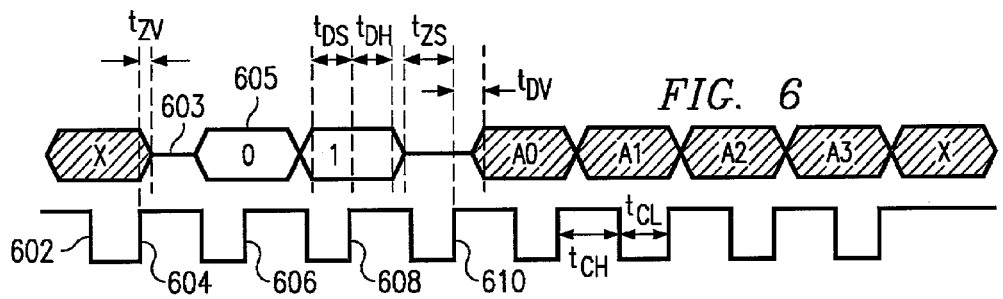
FIG. 6 illustrates a timing diagram for the AddressRead timing.

Referring now to FIG. 6, there is illustrated a timing diagram for the AddressRead command. In this example, a four bit address will be read from the address register 416. As was the case with the Write timing, the instruction begins with a start bit when the reset line initially goes low, at a transition 602, where the function block 212 is active in the normal operating mode, such that the serial data pin is under control of the CPU 211. However, when the next transition 604 occurs, this occurring before the reset time of the reset detect block 210, this indicates that the serial mode is being initiated. If it were a Reset operation, typically, the time between a negative going transition and a positive going transition must be greater than five or ten $\mu s$. However, if it is less than that, then this indicates a start bit. Therefore, the start bit indicates that the possession of the data pin should be directed to the serial interface controller 214 and taken away from the CPU 211 and function block 212. The shaded areas on the data indicate the data line is being driven by either the serial interface circuitry on the integrated circuit 102 or other circuitry on the integrated circuit 102 and non-shaded areas indicate driving by the translator 106. After the transition 604, the translator 106 will enable its output driver.

In the diagram, the box 601 indicates that the function block 212 has possession of the pin, whereas the translator 106 tri-states its driver. At edge 604, the driver associated with translator 106 is enabled, which has some delay associated therewith, resulting in the output of the translator driver being tri-stated, indicated by a state 603. This is where possession of the pin is transferred or "stolen," indicated by a time period $t_{zv}$ of approximately 1 to 20 ns. This will result in data being output in a data valid field 605 for the first command bit at the end of state 603. This data will then be output by the translator 106 and will be shifted in at the next rising edge, edge 606, to shift in an instruction bit, a "0" bit, and then another and subsequent data bit will be shifted in at the following and second rising transition 608 to shift in another instruction bit, a "1" bit. For an AddressRead command, the control word is a "01" that is read by the controller 432, which controller 432 is operable to recognize the first two bits shifted in as the appropriate command to determine whether this is a Read or a Write operation. Once it recognizes the first two bits as being a "01," it then knows to load the contents of the address register into the shift register 406 and then the data direction will be reversed and the translator 106 will await data transfer from the integrated circuit 102.

In general, when the shift register is clocked on a rising edge, it is preceded by a data setup time period, $t_{DS}$, of approximately 10 ns and, after the rising edge of the clock, data is held therein for a time, $t_{DH}$, of approximately 10 ns. After this data hold time for the second command bit received, and during the AddressRead command, the output of the translator will be tri-stated which will require a tri-state setup time, $t_{ZS}$, of approximately 10 ns to allow the bus direction to be reversed, this occurring on the next rising edge 610. The LSB of the address register, address bit A0, will be driven out to the multiplexor 414 and the driver 415 to the line 404, which will be sampled by the translator 106. Thereafter, four more rising transitions will be required to complete the AddressRead command of the four bit address, it being noted that there is no stop bit required for a AddressRead command. The device will automatically return the shared data pin to its user-defined state after the last bit of the AddressRead command is completed.

Figure 7:
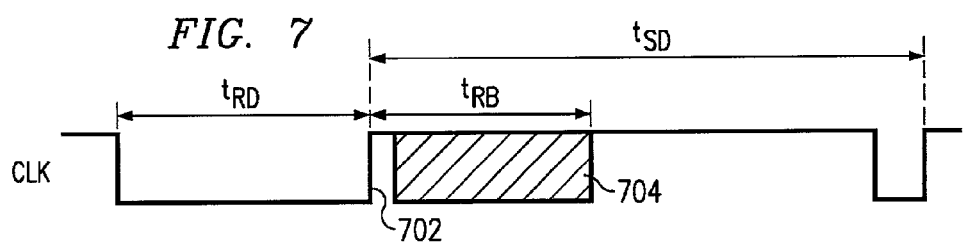
FIG. 7 illustrates a timing diagram for a device reset.

Referring now to FIG. 7, there is illustrated a timing diagram for a device reset. During transmission of serial data instructions, the serial data clock line must not be held low longer than $t_{CL}$, which has a minimum time of 20 ns and a maximum time of 5000 ns. This requirement allows the device to be reset by holding the serial clock line low for an extended period of time given by $t_{RD}$ which has a minimum value of approximately 10 μs. If a Reset is detected, this will reset all device logic on the integrated circuit 102, including the serial controller interface 214, regardless of the state thereof. After a Reset and once the serial clock line/reset line returns high, at an edge 702, the serial interface controller 214 will ignore any additional strobes for at least a time period, $t_{RB}$, of a minimum of 100 ns to a maximum of 1 μs, this being a blanking region illustrated by cross-hatched area 704. This prevents extra edges on the serial clock line/reset line when releasing the system from reset from initiating an instruction. The start bit of the first instruction after reset must begin at least a time period $t_{RD}$ after reset, which has a minimum time of 2 μs. However, it should be understood that the serial data interface can be operated in any mode wherein a device reset is not required, i.e., any time there is a falling edge and rising edge less than a reset time occurring, wherein this will indicate a start bit and data can be read or written to the serial interface controller 214 and the operation can be "stolen" from the CPU of the data pin. However, for the present disclosure, the serial interface requires knowledge of the state of the integrated circuit before stealing the pins. The instructions are sequentially input in accordance with a state machine running in both the integrated circuit 102 and the translator 106, requiring that the instructions be initiated at a known state, i.e., synchronized. In some situations, the input of data may not require synchronization between two state machine, such as for loading a register with a value. For the synchronous state machine condition, by utilizing a device reset, the state machine of the serial interface controller 214 can be reset to a known state and instructions initiated therefrom, such that both state machines are synchronized.

The serial interface protocol, in the present disclosure, provides four basic instructions named Address write, AddressRead, Data write and Data read. This, therefore, requires a two bit command instruction. Each instruction will be described as a sequence of bits, each sequence shown with the LSB on the right and shaded bits indicated as being driven by the serial interface controller 214 or other circuitry on the integrated circuit 102.

Figure 8:
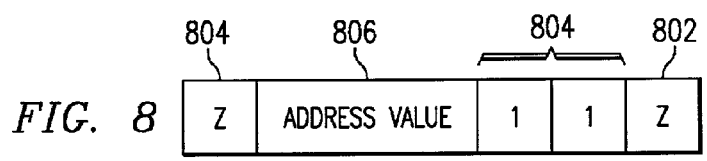
FIG. 8 illustrates the bit sequence of an AddressWrite instruction.

Referring now to FIG. 8, there is illustrated a diagrammatic view of the Address write instruction. This instruction is an instruction that sets the address register to a specified value. This value controls the data register selected for any Data write or Data read instruction until the next Address write instruction or device reset. The Address write instruction consists of an LSB 802 which is a high-Z bit (generated by the translator 106) followed by two command bits, "11" in a field 804. As described herein above, these two command bits are read by the controller 432, indicating that the next sequence of bits, a defined field 806, will be read as the address value. After this defined field length, a high-Z bit will be present driven by the translator 106, in a field 804. Again, as noted herein above, the length of the field 806 must equal the address register length of the address register 416 for the serial controller interface 214. This was determined from a Read of the device ID register, an 8-bit read-only register, that provides the hardware ID for the serial control interface. The device ID is automatically selected by a device reset and, thus, can be read without any knowledge of any other register sizes in the device. A subsequent Data read command having an 8-bit length will read the contents thereof. Conversely, when an address value determined from reading the device register is input as the address in an Address write command, this will select the revision ID register 420, with a subsequent Data read command operable to read out the contents of the revision ID register 420. This therefore allows the device to be initially identified by performing a 1-byte Data read instruction immediately after a device reset to obtain the device ID value. This basically configures the state machine in the translator for subsequent Read/Writes.

Figure 9:
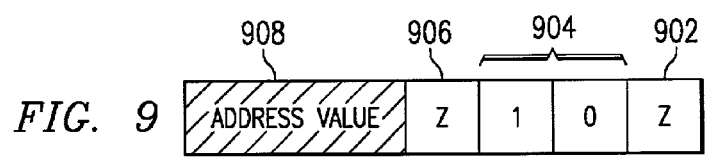
FIG. 9 illustrates the bit sequence of an AddressRead instruction.

Referring now to FIG. 9, there is illustrated a diagrammatic view of the bit sequence for an AddressRead instruction. The first bit in the sequence is a high-Z bit in a field 902 followed by the command instruction "10" in a field 904 indicating a AddressRead command. This is followed by a high-Z state in a field 906 where the bus direction is reversed and then the address value is output, in a field 908. The length of the address value must equal the address register length for the device.

Figure 10:
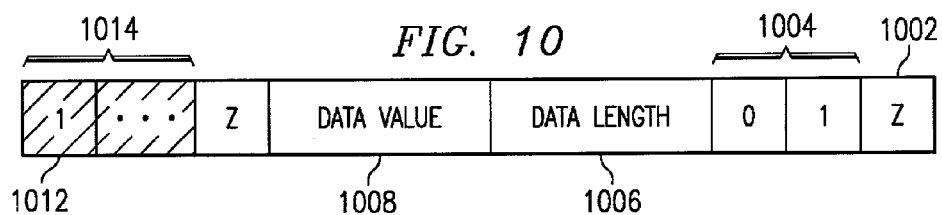
FIG. 10 illustrates the bit sequence for a DataWrite instruction.

Referring now to FIG. 10, there is illustrated a diagrammatic view of the bit sequence for a Data write command. In the Data write command, the selected data register is set to a specified value. The Data write instruction, as all instructions are, is initiated with a high-Z start bit 1002 followed by command field 1004 with a bit sequence of "01." This is then followed by a specified number of bits that define the data length, this being a 2-bit field that specifies the Data value field in bytes −1. The Data length field 1006 is followed by a Data value field 1008 having a length defined by the Data length field 1006. This is then followed by a high-Z bit 1010, which is a bus turnaround state. Thereafter, there is output by the serial control interface 214 a wait state which is a sequence of "0's" followed by a 1-bit 1012. The "0's" are illustrated by a series of " . . . " prior to generation of the "1." This " . . . " represents zero or more "0's" transmitted by serial control interface 214. With the use of this wait state, access to slower memories or registers is supported by letting the state machine on the integrated circuit 102 stall an instruction while waiting for an access to be complete. The length of this wait state can be fixed or it can be deterministic, i.e., determined by an internal flag or the such. The wait state removes the need for subsequent instructions in protocols such as JTAG that require handshakes to determine that the receiving device is ready to receive information.

As an example, if the value in the data length field 1006 were equal to "0b00," (in ANSI-C binary notation) the Data value would be 1 byte long. It is noted that the value of Data length does not necessarily equal the length of the actual data register to be written. For example, if only the 8 MSB's of a 10-bit data register was required to be written, Data length could be set to "0b00" and the Data value in field 1008 would define just the 8 MSB's of the register. The remaining register bits will be written with undefined values. To write to the entire register, Data value must be two bytes long (therefore Data length="0b01"). In this case, the 10-bit value to write must be left-justified in the 16-bit Data value field. The value of the padding bits is unimportant.

After the Data value and the "Z" bit is transmitted, the serial control interface 214 will provide a wait-state response, wherein the actual write occurs on the last rising edge of the serial clock. In general, the combination of the last "1" bit 1012 and the wait state of "0's" constitutes a field 1014 which is an acknowledgment or "ACK" field that prevents another instruction from being initiated by the state machine in the translator 106. After transmission of the last "1" in the field 1012, the instruction will end.

Figure 11:
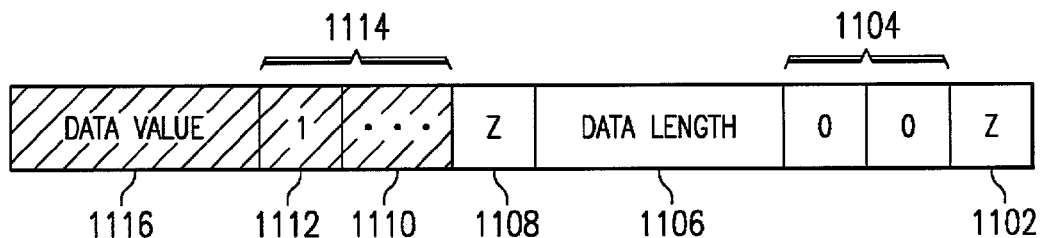
FIG. 11 illustrates the bit sequence for the DataRead instruction.

Referring now to FIG. 11, there is illustrated a diagrammatic view of the bit sequence for the Data read instruction. This instruction returns the selected data register value that was defined by the previous address that was provided in the Address write instruction. The Data read instruction consists of a sequence as initiated with a start bit 1102 as a high-Z bit followed by a command field 1104 of two "0" bits as a field "00." This is followed by a data length field 1106, which has the same format as in the Data write instruction as described herein above with respect to FIG. 10. As with the Data write instruction, the Data length does not necessarily have to match the length of the selected data register. If only the LSB of the addressed data register need to be read, Data length can be set to fewer bytes than available in the register. After the Data length field has been received, a high-Z state or bit is then received in a field 1108, indicating that the bus is to reverse direction such that data can be transmitted therefrom. Initially, there will be a wait state field 1110 of a plurality of "0's" followed by a "1" in a field 112, all comprising a wait sequence 114 to allow the registers to be addressed. After this wait sequence 1114, a Data value field 1116 follows.

When reading a data register whose size is less than Data length, the register read will be right-justified in the Data value field with undefined bits as padding. If Data value is longer than the register Read, the value is right-justified.

Note that the data read in the field 1116 is transmitted LSB first immediately after the "1" bit 1112 is transmitted.

The four instructions that were described herein above are of use when programming the serial controller interface 214 and for testing the operation thereof. However, there are other features provided in the serial interface controller 214 to support in-system debugging. These include support for sharing the serial clock and serial data pins with user functions, detecting a halt command in the serial control interface 214 without using the serial data pin, and forcing a serial control interface 214 halt also without utilizing the data pin.

Figure 12:
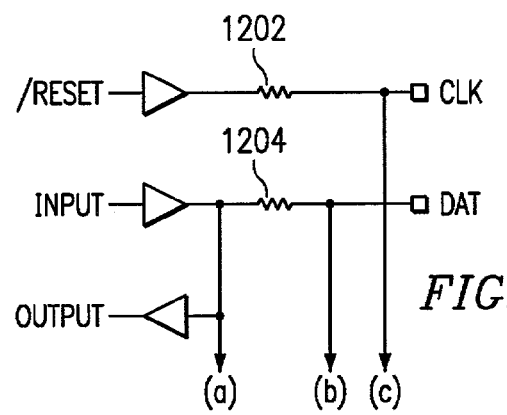
FIG. 12 illustrates a schematic diagram for the external interface to the serial interface pins.

Referring now to FIG. 12, there is illustrated a schematic diagram of circuitry utilized to allow a serial interface with the integrated circuit 102 when in normal operation. When, for example, a debugging operation is required, the IDE software typically communicates with the serial control interface 214 only when it is halted. Since all user software and peripherals are stalled in this state, the serial control interface 214 can temporarily "steal" the serial clock and serial data pins from the application. This is accomplished by providing two external resistors 1202 and 1204 connected to the serial clock pin and the serial data pin, respectively. The other end of the resistors 1202 and 1204 are connected to the reset function pin and the data/input/output function pin, respectively. Upon detecting that the device has entered its halt state, which will be described herein below, the translator 106 then samples the logic level on the side of the resistor 1204 labeled (a) and then drives that same level back onto the node (a). This allows it to then control the serial data at the node labeled (b) and the serial clock at the node (c) without effecting the state of the user's system.

When the system on the chip is released from halt, i.e., all of the registers and software instructions and states that were halted will resume normal operation and the translator 106 will immediately disable its driver on the node (a). The reason for this is that there may be signals on the shared data pin that are driven at one state or the other when the integrated circuit 102 is in the middle of an application. When the node (b) is forced to a different state, this would require an "overdriving" situation. For example, if the input were at a logic "high" at node (a) and it was desirable to pull the node (b) low once the pin has been "stolen" by the translator 106, it might be that the current draw from pulling the node (b) low would effect the driver from the peripheral circuitry that is driving the data pin in normal operation. As such, additional drive current could be added at the node (a) by the translator 106. Once the device goes out of halt, this driver at node (a) from the translator 106 would be removed. In certain situations, as will be described herein below, a request can be made by the serial control interface 214 for the CPU 211 to halt its operation, i.e., suspend operations at their current state. However, until the system is halted, it may not be desirable to steal the operation of the data pin associated with the function block 212 at the multiplexor 302 (although this situation is contemplated in certain "overriding" operations). As such, it would not be desirable to send an instruction which would require data to be input to the associated data pin by the translator 106. Thus, there is provided a way to signal the translator 106 that the system has been halted, such that the shared pin can now be placed in the serial data mode such that data can be transmitted/received from the serial control interface 214. In general, the system may enter its halt state due to an enabled break point, a watch point, or some other on-chip debug feature. The serial control interface 214 monitors for such an event. To facilitate communication of this event, the control block 432 will output a signal on line 450 forcing the serial clock line 440 low, as illustrated in FIG. 4. This is facilitated with the block 442. In general, the clock drivers are open collector drivers that are operable to pull the clock line low, with some type of pull up device disposed on the line. Therefore, it is only necessary to provide an open collector pull down on the line 450 to pull the line 440 low for a preset time. This is a single active-low strobe which is low for approximately 400 ns, thus allowing the serial control interface 214 to provide what is, in effect, an interim source that can be monitored by the translator 106 to detect a halt condition in the device without using the shared data pin, thus allowing the shared data pin to operate in conjunction with the overall chip in operation. The translator 106 must wait at least approximately 1000 ns after the strobe before initiating a serial instruction, this providing an internal blanking period which improves noise immunity.

Figure 13:
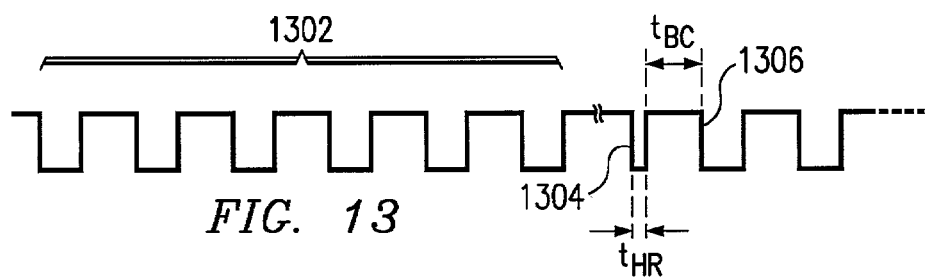
FIG. 13 illustrates a timing diagram for the device halt.

Referring now to FIG. 13, there is illustrated a timing diagram for the operation of detecting a device halt. In FIG. 13, the clock is illustrated as providing a plurality of clock transitions 1302 that represent an instruction. At a later time, a falling edge 1304 indicates the strobe which is driven by the serial control interface 214, whereas the previous clock cycles in the instruction 1302 are driven by the translator 106. Once this has been detected, a subsequent falling edge 1306 indicates the beginning of an instruction from the translator 106. The serial control interface 214 is designed, such as to accommodate the situation where an instruction is sent to the serial interface controller 214 prior to the acknowledgment being received by the translator 106. Since the pulse width of the active-low strobe at edge 1304 is less than the active-low portion of the serial clock, the serial clock will "swallow" the active-low strobe if there is contention. The serial control interface 214 will recognize that the clock line is still low after it has released the clock line and, as such, will recognize this as a start bit and then will proceed accordingly.

One use of the active-low strobe is to provide an acknowledgment when the system halt has occurred in response to receiving an external signal to force the halt. In this operation, a bit in one of the data registers is written in a previous instruction that constitutes an AutoHalt feature. The Auto-Halt feature is a feature that, when enabled, causes the state machine of the serial control interface 214 to monitor the serial clock line and, upon detecting the next rising edge of the serial clock, to automatically set the halt request flag which is output to the CPU 211 and the rest of the system. Typically, when the state machine of the serial control interface 214 is operating, the overall system is at a "halt" mode. When the state machine has finished executing all of the operations associated therewith, it will then release this system from the halt condition. Just prior to releasing the system from the halt condition, the translator 106 would write the AutoHalt bit to the appropriate logic level, typically a "1." Thereafter, the translator can generate an Auto-Halt strobe on the clock/reset line with a clock low time of approximately 3 $\mu$s. This will ensure that it will be recognized by the serial control interface 214 even when generated coincident with the active low strobe that may be generated when indicating that the system is to be halted.

Referring now to FIG. 14, there is illustrated a flowchart depicting the operation for the AutoHalt feature. This is initiated at a Start block 1402 and then proceeds to a function block 1404 to indicate that this system is already in a halted mode, such that the shared data pin is directed toward the serial control interface 214. In this mode, the translator 106 is communicating with the integrated circuit 102 over that shared pin. In this communication, a command embedded within an instruction is sent to set the AutoHalt bit, as indicated by a function block 1406. This program then flows to a function block 1408 wherein a command is sent to the serial control interface 214 to clear the halt request to the CPU 211, it being noted that both of these commands are embedded within the same instruction. The clearing of the halt request flag also then changes the operation such that the shared data pin is now directed toward the function block 212 and the overall operation of the system in the normal application mode. The program then flows to a decision block 1410 to determine if an external halt instruction is required to be generated by the translator 106. If this is case, the program will flow along the "Y" path to a function block 1412 to generate the AutoHalt strobe at the translator 106. The clock line will be pulled low for approximately 3 $\mu$s, and the rising edge thereof will cause the serial control interface 214 to generate a halt request, as indicated by a function block 1414. The program will then flow to a decision block 1416 to determine if the system has been halted. Once the system has halted, the CPU 211 or other circuitry in the system will indicate to the serial control interface 214 that a halt condition has occurred. The program will flow along a "Y" path from the decision block 1416 to a function block 1418 to generate the active-low strobe on the serial clock line and then the program flows to function block 1422 wherein the serial control interface 214 waits for instructions to be received from the translator 106. When the start bit of the instruction is received, the program flows to function block 1420 to steal the shared data line such that it is directed toward the serial control interface 214.

In order to guarantee the ability to reset and program an uninitialized device (i.e., a device with random program context), the serial control interface 214 and the overall system on the integrated circuit can be reset regardless of its current state by holding the serial clock line low for the time $t_{RD}$. As described herein above, the serial clock line driver is an open-drain driver such that it cannot prevent the reset operation. Any logic that is used for debugging or in any way running the state machine of the serial control interface 214 is disabled by the reset operation. This guarantees that a halt request cannot be generated on-chip regardless of the program contents. This prevents any strobing of the clock line by the serial control interface 214. Further, as also described herein above, the reset state of the address register selects a device ID, such that the device can be identified without any knowledge of the device-specific interface features.

Referring now to FIG. 15, there is illustrated a diagrammatic view of another mode of operation. This mode of operation is referred to as the TestMode command. In certain situations, during testing, it is desirable to not have to continually turn on and off the serial clock in order to sequence instructions, it being noted that the serial clock is required to generate the start bit. In the TestMode mode of operation, a single serial clock is utilized for both serial data communication and the operation of the CPU 211 and all circuitry associated therewith. As noted herein above, the serial interface to the integrated circuit 102 and the operation of the integrated circuit 102 are typically asynchronous; that is, a separate clock is provided for the CPU 211 that is not synchronized with the serial clock utilized for serial data communication. To facilitate this, a multiplexing device 1502 is provided that has two inputs, one for receiving an external clock signal on a line 1504 and the other for receiving an input line 1506 that is connected to the serial clock input line, a line 1508. Data for the serial data operation is provided on a line 1510, which line 1510, although not illustrated, is connected to one of the shared pins which would be shared with the operation of the CPU 211. Both the serial clock line 1508 and the data line 1510 are input to the serial control interface 214.

In operation, an instruction would be sent to the serial control interface 214 to enter a mode wherein the multiplexor 1502 would select as the clock input to the integrated circuit 102 the serial clock that is received from the reset pin. It should be understood that the output of the multiplexor 1502 can drive many on chip functions with the clock, this being the main clock for the chip for the integrated circuit 102. However, for the serial data mode as described herein above, the Start bit for each instruction requires a detection of a rising edge on the clock line. In the TestMode mode of operation, the serial control interface 214 enters a mode where the shared data pin is permanently possessed by the serial control interface and the application that is normally running on the integrated circuit 102 is allowed to operate when instructions are not being transmitted, noting that shared data pin is no longer available to the application during TestMode. However, when instructions are to be transmitted, the Start bit comprises the operation of the shared data pin 1510 being high.

Referring now to FIG. 16, there is illustrated a detailed timing diagram of the operation of the data pin and the serial clock pin during the TestMode mode of operation. As noted herein above, during this mode of operation, the serial clock will be continuously running, due to the fact that it provides the master clock to the CPU 211. The data line, however, will be permanently possessed by the serial control interface 214. When an instruction is not being sent, it is not in the serial data mode, and the data pin 1510 will be held low. When the data on the shared data pin is high at 1604, and upon the next rising edge of the clock, an edge 1606, this will constitute a start bit. This will be similar to the sampling operation described herein above with respect to FIGS. 5 and 6. At the end of an operation wherein a Stop bit is required, the data line 1510 is merely held low without the requirement for a tri-state, for example, the end of a Write operation.

Referring now to FIG. 17, there is illustrated a diagrammatic view of a circuit for providing a parallel port interface for device programming, such that the serial clock can be operated from the parallel port of a computer. This is to allow users the ability to program devices for production using custom software rather than the built-in interface software. Working from the parallel port of the computer, it is difficult to ensure maximum high and low times for the clock signal due to the multi-tasking nature of most operating systems. The solution is to provide a one-shot circuit 1702 wherein a low-going strobe will be generated at an input 1704 which is coupled to the input to the one-shot 1702 with a capacitor. A second input 1710 is input to the one-shot 1702 through a series-connected resistor 1712. The output of the one-shot 1702 will generate a low strobe on a line 1714, the clock line, when the node 1704 is changed from a high to a low while node 1710 is high. A device reset can be generated by holding both nodes 1710 and 1704 low. Further, it is possible to perform debugging across the parallel port if the parallel ports interrupt capability (nACK pin) is utilized to detect the strobe that is output on the clock line from the integrated circuit 102 and the serial control interface 214. To support this option, it may be that the length of time that the strobe is active will have to be extended. It is also possible to utilize the Enhanced Parallel Port (EPP) to generate a strobe appropriate for the serial clock rather than the circuit illustrated in FIG. 17.

Figure 18:
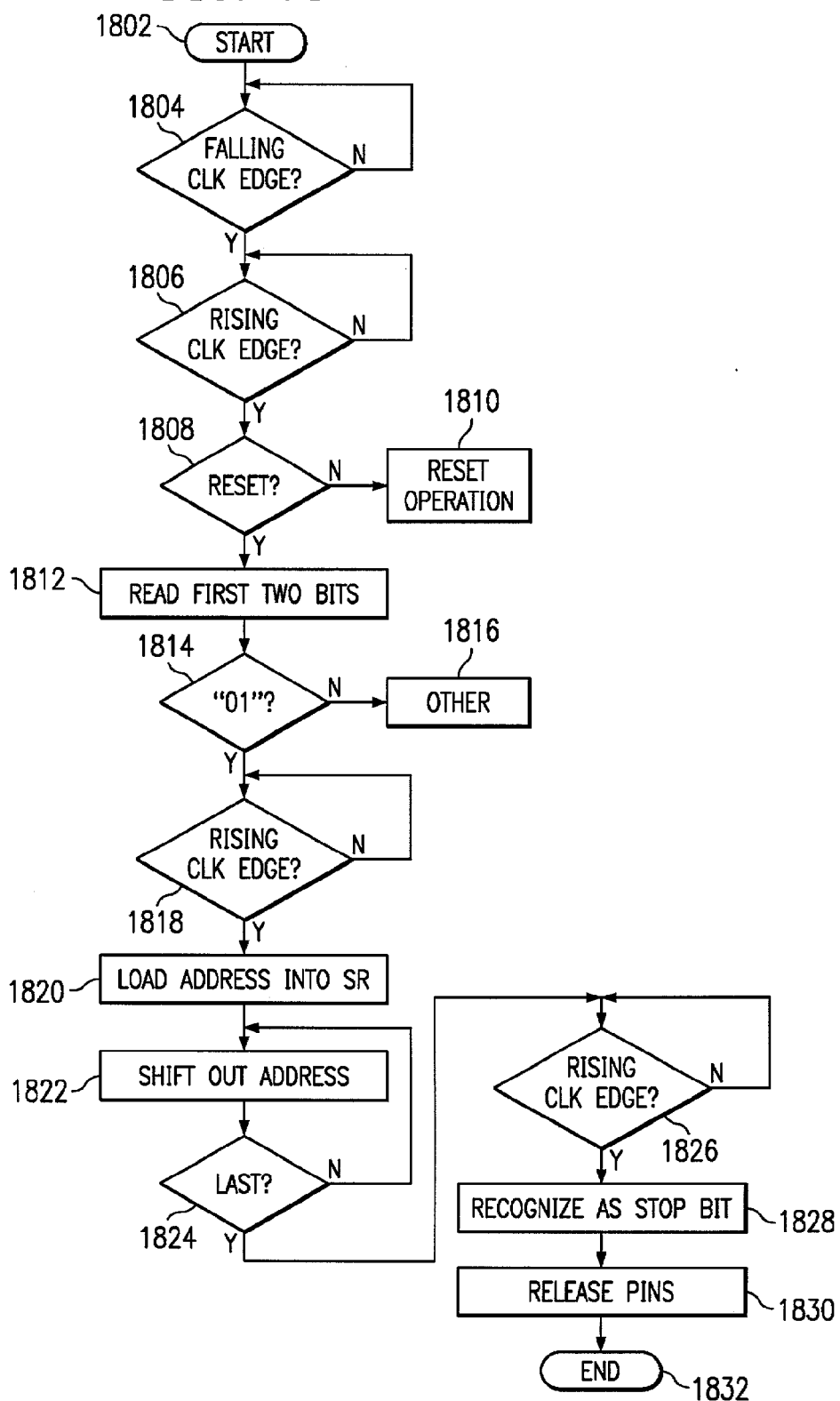
FIG. 18 illustrates a flowchart for the operation of receiving and processing a ReadAddress command.

FIG. 18 illustrates a flowchart depicting the operation of the serial control interface 214 for receiving and processing a ReadAddress command. The program is initiated at a block 1802 and then proceeds to a decision block 1804 to await the first falling clock edge on the Reset Pin, this being the serial clock pin also. When the first falling clock edge occurs, this is recognized by the state machine in the serial control interface 214. The serial control interface 214 then awaits the next rising edge, as indicated by a decision block 1806. When the rising clock edge occurs, then a determination must be made as to whether the length of time between the falling edge and the rising edge is less than the reset time, as indicated by decision block 1808. If greater than or equal to the reset time, then the program will proceed along the "N" path to a block 1810 indicating that the reset operation is to take place. However, if it is less than the reset time, this indicates a Start bit for serial data transfer and then the program will proceed along the "Y" path to a function block 1812 wherein the first two bits received will be read. As noted herein above, the controller 432 is operable to monitor the contents of the shift register 406 and the first two locations therein. As soon as these first two locations are clocked in, the particular command being generated will be recognized and then the appropriate actions taken. In the case of a ReadAddress, which timing diagram is illustrated in FIG. 6, the next action to be taken by the controller 432 is to reverse the bus such that data is transmitted and then load the shift register 406 with the appropriate address bits. Since a known register is being read, it is not necessary to actually send an address for this particular register with the previous instruction as an Address write command. The decision as to what the command constitutes is made at a decision block 1814. If the command is not for the ReadAddress command, the program will proceed along a "N" path to a block 1816 indicating the processing for other commands. However, if it is a ReadAddress command, the program will flow along a "Y" path to a decision block 1818 to await the next rising clock edge. As described herein above, the translator 106 will basically tri-state its output and then go to a Read mode to await data, i.e., it will sample the data line at appropriate times.

When the rising clock edge occurs, the program will flow from the decision block 1818 along a "Y" path to a function block 1820 to load the address from the address register 416 into the shift register 406. The program will then flow to a function block 1822, wherein each address bit will be shifted out on subsequent rising edges of the clock, as described herein above with reference to FIG. 6. The program then flows to a decision block 1824 to determine if the last bit has been shifted out. If not, the program then flows along a "N" path back to the input of function block 1822 until the last bit has been shifted out (this being a predetermined number that was determined from a reading of the Deiced register during a previous instruction). Once the last bit has been shifted out, the program flows along a "Y" path to a decision block 1826 to determine if the next rising edge of the clock has occurred. If so, the program will flow along the "Y" path to a function block 1828 to recognize this as the stop bit and then to a function block 1830 to release the pins, i.e., return the pin to the normal operating mode, and then the program flows to an End block 1832.

Figure 19:
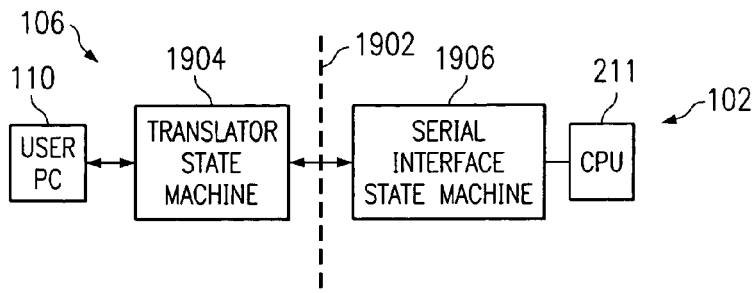
FIG. 19 illustrates a diagrammatic view of the two state machines.

Referring now to FIG. 19, there is illustrated a diagrammatic view of the state machines operating between the translator 106 and the serial control interface 214. There is provided a boundary 1902 indicating the boundary between the integrated circuit 102 and the translator 106. The translator 106 is operable to run a state machine 1904 that receives information from the user PC 110 in its appropriate serial data format and converts this data to the appropriate commands to interface with the integrated circuit 102, which has a serial interface state machine 1906 operating thereon. This serial interface state machine 1906 allows data to be transmitted to the CPU and retrieved there from. As noted herein above, the translator state machine 1904 generates its own internal clock and is asynchronous with respect to the user PC 10. Similarly, the serial interface state machine 1906 is asynchronous with respect to the operation of the CPU 211 (assuming this is not the TestMode mode of operation). The translator state machine 1904 generates both the command information embedded within the instructions and also the timing information. The translator state machine will basically generate the starts bits, which will be recognized by the serial interface state machine 1906. This will be followed with the output of command information on the data pin to the serial interface state machine 1906, which state machine 1906 is operable to, upon recognizing a start bit, steal the data pin. Typically, the translator state machine 1904, when sending a start bit, recognizes that the possession of this data pin can be taken by the state machine 1906. The reason for this is that the translator state machine 1904 recognizes that the integrated circuit is in a "known" state. This is due to the fact that a previous reset operation occurred or, alternatively, that a device halt was detected and relayed to the translator state machine 1904 by the serial interface state machine 1906 via the clock line, as described herein above. As such, there are provided two independently operating state machines, of which one state machine receives timing information from the other state machine. However, both machines operate independent of each other.

Figure 20:
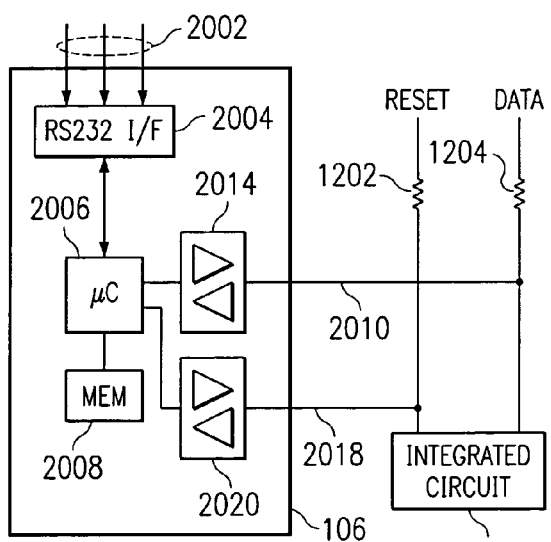
FIG. 20 illustrates a diagrammatic view of the translator 106.

Referring now to FIG. 20, there is illustrated a diagrammatic view of the translator 106. The translator 106 can incorporate any type of processing device that will receive data from the user PC 110 in the appropriate format, which is illustrated in the present invention as being associated with an RS232 interface on the serial data lines 2002. In one embodiment, the translator 106 is realized with a CS8051 Mixed Signal MCU, manufactured by Cygnal Integrated Products. Typically, a serial data line will have a data line, a transmit/receive line and a clock line. When data is to be transmitted to the translator 106 from the user's PC, it is synchronously transmitted to the translator 106 and to an RS232 interface 2004. This data will be clocked in and buffered. Similarly, when data is to be transmitted back to the user PC, handshake signals that data is being transmitted from the translator 106 to the user PC 110 is then provided in accordance with the RS232 protocol and data transmitted along the RS232 serial data line. This is a conventional interface. Also, it should also be understood that multiple other serial data interfaces or even parallel interfaces could be utilized to transfer data between the user PC and the translator 106. For example, and I2C protocol could be utilized, a D2B protocol could be utilized, etc.

A microcontroller 2006 is provided which is operable to control the interface 2004 and also run the state machine. A memory 2008 is provided for containing instructions for operating the state machine associated therewith. The microcontroller 2006 is operable to transmit and receive data on a data line 2010 to the shared data input pin of the integrated circuit 102. A transmit/receive circuit 2014 is provided for transmitting and receiving data and buffering the data transmitted between the microcontroller 2006 and the line 2010. Similarly, the clock signal is generated by the microcontroller 2006 on a line 2018 for input to the reset pin input of the integrated circuit 102, as described herein above. Typically, a transmit/receive circuit 2020 is provided, noting that information can be received from the integrated circuit 102 via the line 2018.

Figure 21:
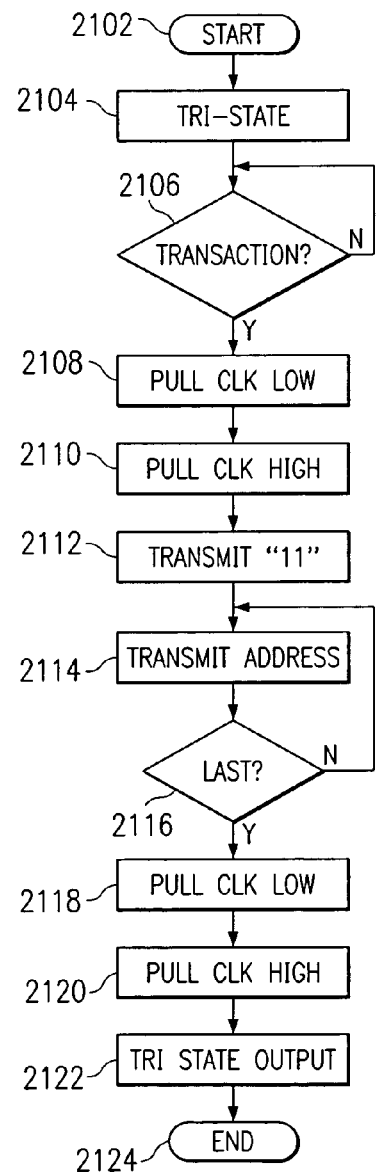
FIG. 21 illustrates a flowchart depicting the operation of an AddressWrite command on the translator.

Referring now to FIG. 21, there is illustrated a flowchart depicting the operation of processing an Address write command in the translator 106, which is initiated at a block 2102 and then proceeds to a function block 2104 wherein it is indicated that the data output of the translator 106 is tri-stated. It is noted, that during this mode, there is no pull down for the reset line. Therefore, the reset line can be pulled low by any other signal. The program then proceeds to a decision block 2106 to determine if a transaction is to be processed, i.e., whether a command is to be sent. If so, the program flows along a "Y" path to a function block 2108 to pull the clock line low and then to a function block 2110 to pull the clock line high before the duration of time indicating a reset. This constitutes a start bit. Upon the next two rising edges of the clock line, the translator 106 will transmit a "11" command indicating an Address write command, as indicated in a function block 2112. The other three commands could also be transmitted for other operations. After transmission of the command, the program flows to a function block 2114 wherein the address bits are sequentially transmitted upon subsequent rising edges. The program then flows to a decision block 2116 to determine if the last address bit has been transmitted. If not, the program will flow back around a path to the input of the function block 2114. Once the last address bit has been transmitted, the program will flow from decision block 2116 along a "Y" path to a function block 2118 to pull the clock line low and then to a function block 2120 to pull the clock line high, this indicating a stop bit. The program then flows to function block 2122 wherein the output is tri-stated and, also, no more low-going clock edges will occur on the clock output 2018. The program flows then to an End block 2124.

Figure 22:
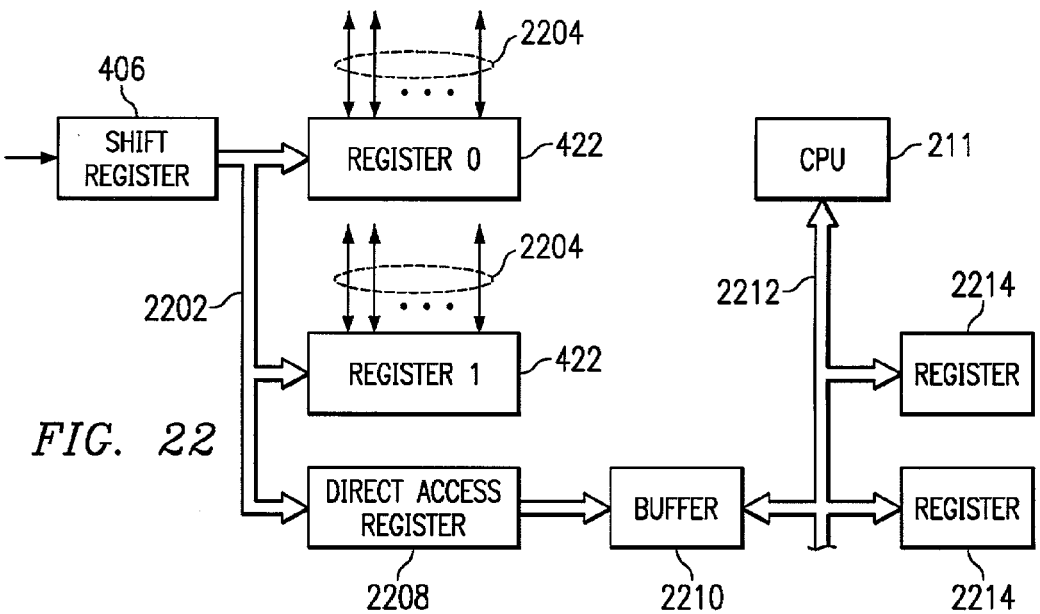
FIG. 22 illustrates a diagrammatic view of the manner in which the data registers interface with the integrated circuit.

Referring now to FIG. 22, there is illustrated a logic diagram detailing the operation of the registers 422 and how they interface with the integrated circuit. For simplicity, the shift register 406 is illustrated as having an output bus 2202 interfacing directly with the data input on the registers 422. Once addressed, a particular register will have the contents thereof written to or read from. Each of the registers 422 constitutes a plurality of register locations for interfacing with a plurality of control lines 2204. Each of the control lines 2204 is operable to interface with some function on the integrated circuit, this being a configuration bit or the such. Further, status information can be derived from the integrated circuit and transmitted back to each of the registers for "setting" the bit to the appropriate logic state such that it can later be read.

In order to transfer information to the CPU 211, a separate data register, a direct access data register 2208, is provided. This register 2208 outputs the contents thereof to a buffer 2210, which is basically a synchronization circuit for interfacing the contents of the register 2208 with a data bus 2212 that is associated with the CPU 211. The CPU 211 interfaces with the various registers 2214 and the such on the data bus 2212 for normal operation thereof. The control circuit 432, when data is to be read or written to the data bus 2212, is operable to write the information in the direct access register 2208 which then, in a conventional manner, will synchronize the operation thereof with the operation on the CPU "address space" by writing information in the buffer 2210 for a Write operation and then setting a flag that will indicate to the CPU 211 that information is in the buffer 2210 to be written to the address space of the CPU 211. For a Read operation, data must be requested from the CPU 211 address space with the appropriate address and then extracted to the direct access register 2208. In general, the direct access register 2208 will occupy some portion of the address space of the CPU 211 and will constitute an addressable location therein. However, the shift register and the serial interface logic associated therewith operates on a different clock than that associated with the CPU 211. Therefore, the buffer 2210, in conjunction with the control circuit 432, provides a synchronizing function between the CPU 211 and the serial bus interface.

Figure 23:
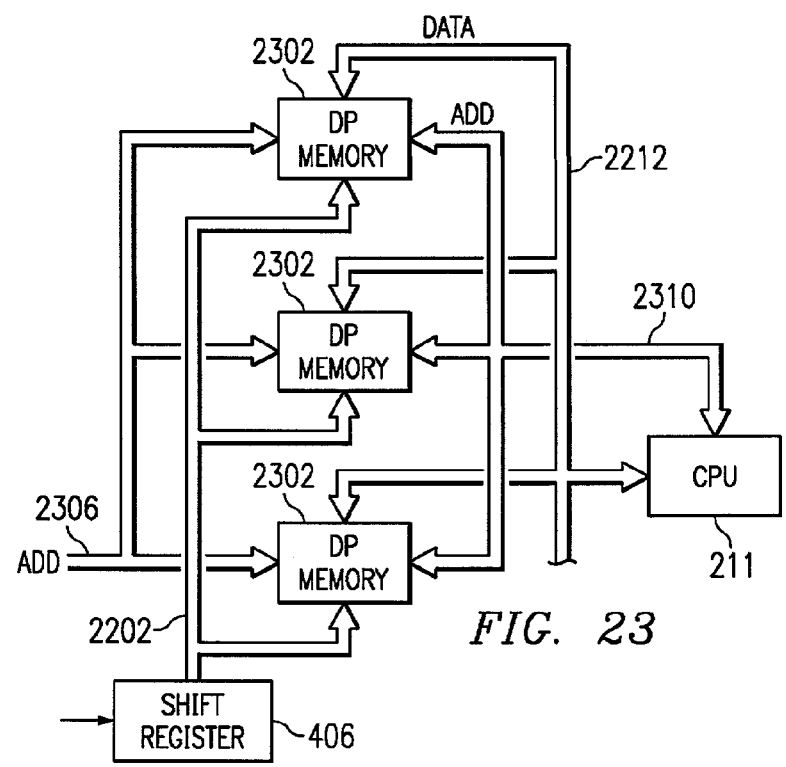
FIG. 23 illustrates a logic diagram of the alternate embodiment utilizing two import memories.

Referring now to FIG. 23, there is illustrated an alternate embodiment of the embodiment of FIG. 22. In this embodiment, there are provided a plurality of dual port memories 2302 that occupy both the address space of the shift register 406 and the serial bus interface, and also the address space of the CPU 211. The shift register outputs data on the bus 2202 and also outputs information that can be extracted therefrom for placing on an address bus 2306. The other side of each of the dual port memories interfaces with the data bus 2212 and an address bus 2310, which in turn interfaces with the CPU 211. The address bus 2310 and the data bus 2212 are in the CPU 211 address space, whereas the address bus 2306 and the data bus 2202 are in the address space of the serial bus interface. The dual port memories are well known and are operable to allow synchronous writing to either side thereof. There, of course, are Read/Write contention protocols that are utilized by the dual port memories 2302.

Although the preferred embodiment has been described in detail, it should be understood that various changes, substitutions and alterations can be made therein without departing from the spirit and scope of the invention as defined by the appended claims.

What is claimed is:

1. A method of serial communication with an integrated circuit, comprising the steps of:
   interrupting a normal operation of the integrated circuit on at least one input/output associated with the operation of the integrated circuit, which normal operation does not include a function of transmitting/receiving serial data; and
   transmitting/receiving serial data over the at least one input/output, the operation of which was interrupted, after and during the interruption thereof.

2. The method of claim 1, wherein the step of interrupting occurs in response to an external interruption signal received by the integrated circuit.

3. The method of claim 2, further comprising the step of receiving the interruption signal on another one of the input/outputs associated with the operation of the integrated circuit.

4. The method of claim 2, wherein the step of transmitting/receiving serial data comprises synchronous transmission/reception of serial data from/to the integrated circuit on the at least one input/output.

5. The method of claim 4, and further comprising the step of receiving a separate serial clock on another one of the input/outputs associated with the operation of the integrated circuit.

6. The method of claim 5, wherein the function of the integrated circuit associated with the other one of the inputs/outputs is overridden in the presence of reception of the serial clock.

7. The method of claim 5, wherein the step of interrupting is initiated in response to the reception of the serial clock.

8. The method of claim 5, wherein the integrated circuit has a plurality of input/output pins, a first of the input/output pins associated with the at least one input/output and a second of the input/output pins associated with the other of the inputs/outputs.

9. The method of claim 8 and further comprising the step of multiplexing the operation of the first of the input/output pins to receive/transmit, in a normal mode of operation, data associated with the operation of the integrated circuit and, in a second serial data mode, to receive/transmit serial data over the first of the input/output pins.

10. The method of claim 9 and further comprising the steps of:
    providing a plurality of registers;
    addressing one of the plurality of registers; and
    storing received serial data in the addressed one of the plurality of registers or extracting information from the addressed one of the plurality of registers and transmitting the extracted information as serial data.

11. The method of claim 10 and further comprising the step of interfacing the registers with the operation of the integrated circuit when uninterrupted.

12. A method of serial communication with an integrated circuit, comprising the steps of:
    receiving a serial clock signal on one input/output associated with an operation of the integrated circuit, which one input/output has a first predefined function associated with the operation of the integrated circuit, which first predefined function associated with the one input/output does not include a timing operation associated transmitting/receiving serial data; and
    transmitting/receiving serial data over at least another one of the input/outputs associated with the operation of the integrated circuit after initiation of the step of receiving the serial clock on the one input/output, which step of transmitting/receiving is synchronized with the received serial clock.

13. The method of claim 12, wherein the at least another one input/outputs has a second predefined function associated with the operation of the integrated circuit, and further comprising the step of interrupting at least the second predefined function on the at least another one of the input/outputs in response to the step of receiving the serial clock signal.

14. The method of claim 13, wherein the step of interrupting occurs prior to the step of transmitting/receiving.

15. The method of claim 13, wherein the first predefined function of the integrated circuit associated with the one input/output is overidden in the presence of reception of the serial clock.

16. The method of claim 13, wherein the integrated circuit has a plurality of input/output pins, a first of the input/output pins associated with the one input/output and a second of the input/output pins associated with the at least another one of the inputs/outputs.

17. The method of claim 16 and further comprising the step of multiplexing the operation of the second of the input/output pins to transmit or receive, in a normal mode of operation, data associated with the operation of the integrated circuit and, in a second serial data mode, to receive and transmit serial data over the second of the input/output pins.

18. The method of claim 17, and further comprising the steps of:
    providing a plurality of registers;
    addressing one of the plurality of registers; and storing received serial data in the addressed one of the plurality of registers or extracting information from the addressed one of the plurality of registers and transmitting the extracted information as serial data.

19. The method of claim 18 and further comprising the step of interfacing the registers with the operation of the integrated circuit when uninterrupted.

20. An integrated circuit with a serial communication interface, comprising:

interruption circuitry for interrupting a normal operation of the integrated circuit on at least one input/output associated with the operation of the integrated circuit, which normal operation does not include a function of transmitting/receiving serial data; and a transceiver for transmitting/receiving serial data over said at least one input/output, the operation of which was interrupted, and during the interruption thereof.

21. The integrated circuit of claim 20, wherein said interruption circuitry interrupts the operation of the integrated circuit on said at least one input/output in response to an external interruption signal received by the integrated circuit.

22. The integrated circuit of claim 21, and further comprising said interruption circuitry is operable to receive the interruption signal on another one of the input/outputs associated with the operation of the integrated circuit.

23. The integrated circuit of claim 22, said transceiver transmits/receives serial data as a synchronous transmission/reception of serial data from/to the integrated circuit on the at least one input/output.

24. The integrated circuit of claim 23, wherein said interruption circuitry includes serial clock circuitry for receiving a separate serial clock on another one of the input/outputs associated with the operation of the integrated circuit, the reception of said serial clock comprising said external interruption signal.

25. The integrated circuit of claim 24, wherein the function of the integrated circuit associated with the other one of the inputs/outputs is overridden in the presence of reception of said serial clock.

26. The integrated circuit of claim 24, wherein said interruption circuitry is operable to interrupt in response to the reception of said serial clock.

27. The integrated circuit of claim 24, wherein the integrated circuit has a plurality of input/output pins, a first of the input/output pins associated with said at least one input/output and a second of said input/output pins associated with said other of the inputs/outputs.

28. The integrated circuit of claim 27 and further comprising a multiplexer for multiplexing the operation of said first of the input/output pins to receive/transmit, in a normal mode of operation, data associated with the operation of the integrated circuit and, in a second serial data mode, to receive/transmit serial data over said first of the input/output pins.

29. The integrated circuit of claim 28 and further comprising:

a plurality of registers;

address circuitry for addressing one of said plurality of registers; and an register control for storing received serial data in the addressed one of said plurality of registers or extracting information from the addressed one of said plurality of registers and transmitting the extracted information as serial data.

30. The integrated circuit of claim 29 and further comprising an interface device for interfacing the registers with the operation of the integrated circuit when uninterrupted.

31. A integrated circuit with a serial communication interface, comprising:

a serial clock interface for receiving a serial clock signal on one input/output associated with an operation of the integrated circuit, which said one input/output has a first predefined function associated with the operation of the integrated circuit, which first predefined function associated with said one input/output does not include a timing operation associated with transmitting/receiving serial data; and a transceiver for transmitting/receiving serial data over at least another one of the input/outputs associated with the operation of the integrated circuit after receipt of said serial clock on said one input/output, the operation of said transceiver is synchronized with said received serial clock.

32. The integrated circuit of claim 31, wherein the at least another one input/outputs has a second predefined function associated with the operation of the integrated circuit, and further comprising an interruption circuit for interrupting at least said second predefined function on said at least another one of the input/outputs in response to receiving said serial clock.

33. The integrated circuit of claim 32, wherein the interruption operation of said interruption circuit occurs prior to said transceiver being enabled for transmitting/receiving.

34. The integrated circuit of claim 32, wherein said first predefined function of the integrated circuit associated with said one input/output is overidden in the presence of reception of the serial clock by said serial clock interface.

35. The integrated circuit of claim 32, wherein the integrated circuit has a plurality of input/output pins, a first of said input/output pins associated with said one input/output and a second of said input/output pins associated with said at least another one of the inputs/outputs.

36. The integrated circuit of claim 35 and further comprising a multiplexor for multiplexing the operation of said second of said input/output pins to transmit or receive, in a normal mode of operation, data associated with the operation of the integrated circuit and, in a second serial data mode, to receive and transmit serial data over said second of said input/output pins.

37. The integrated circuit of claim 36, and further comprising:

a plurality of registers;

addressing circuitry for addressing one of said plurality of registers; and a register control for storing received serial data in the addressed one of said plurality of registers or extracting information from the addressed one of said plurality of registers and transmitting the extracted information as serial data.

38. The integrated circuit of claim 37 and further comprising an interface for interfacing said registers with the operation of the integrated circuit when uninterrupted.

* * * * *